United States Patent

Rathbone

[11] Patent Number: 6,015,718
[45] Date of Patent: Jan. 18, 2000

[54] INDENTIFICATION OF THE COMPOSITION OF PARTICLES IN A PROCESS CHAMBER

[75] Inventor: Richard A. Rathbone, Austin, Tex.

[73] Assignee: Cypress Semiconductor Corporation, San Jose, Calif.

[21] Appl. No.: 08/911,471

[22] Filed: Aug. 14, 1997

[51] Int. Cl.7 .............................. H01L 21/66; G01R 31/26
[52] U.S. Cl. ............................................... 438/17; 324/765
[58] Field of Search ................................... 324/765, 758; 438/14, 17, 18

[56] References Cited

U.S. PATENT DOCUMENTS

4,411,729  10/1983  Komeno ..................................... 117/93

*Primary Examiner*—Brian Dutton
*Attorney, Agent, or Firm*—David R. Graham

[57] ABSTRACT

The invention enables the identification of particles in a chamber in which a substrate is processed (e.g., a semiconductor process chamber). Such identification can be accomplished by placing a test substrate [(i.e., a substrate that is examined to detect and identify particles present on the substrate)] in the process chamber and inspecting the test substrate, where the composition of the test substrate is chosen so as to enable identification of particles having a composition that includes one or more of a predefined set of elements. For example, the composition of the test substrate can be chosen so that each of the elements that substantially comprise the composition of the test substrate are different than each of the elements that substantially comprise the composition or compositions of a process substrate or substrates [(i.e., a substrate that has been processed in the chamber during the normal course of operation of the chamber)], thus enabling the identification of the presence in a particle of an element that is part of the composition of a process substrate. The invention can be used generally to identify the composition of particles in any type of process chamber used to process any type of substrate; however, the invention can be particularly advantageously used to identify the composition of particles present in a semiconductor process chamber and, in particular, such chamber that is used to process substrates made of silicon. In such case, the test substrate can have a composition that includes substantially no silicon. A test substrate for use with the invention can be made of, for example, Teflon™, gallium arsenide, ruby or some combination of those materials.

16 Claims, 3 Drawing Sheets

INDENTIFICATION OF THE COMPOSITION OF PARTICLES IN A PROCESS CHAMBER

BACKGROUND OF THE INVENTION

1. Field of the Invention

This invention relates to the detection of particles in a chamber in which a substrate is processed and, in particular, to the identification of the composition of such particles. Most particularly, the invention relates to the identification of the composition of particles in a semiconductor process chamber.

2. Related Art

A variety of devices (e.g., integrated circuit chips, flat panel displays, microminiature mechanical sensors) can be manufactured in whole or in part by appropriately processing a semiconductor substrate (e.g., a semiconductor wafer) in a semiconductor process chamber. Manufacturers of such devices are continually seeking to improve the yield of each of the semiconductor processes used in making the devices. An important aspect of improving the process yield of a semiconductor process is the reduction of the presence of contaminants in the semiconductor process chamber during processing of a semiconductor substrate. (This is true of the processing of other types of substrates in other types of process chambers, as well.) Identifying the source or sources of contaminants in a process chamber can be an important first step in reducing the presence of contaminants in the process chamber. To enable identification of the source(s) of contaminants in a process chamber, it is helpful to identify the composition of contaminants present in the process chamber. It is often desirable to be able to do this without opening the process chamber, since opening the chamber may result in an extended period of non-operation of the chamber. Further, it is desirable to be able to identify the composition of the contaminants with confidence, so that solutions to the contamination problem needn't be discovered by trial and error.

The presence of contaminants in a process chamber can be detected by examining a substrate that has been present in the chamber to determine whether particles are present on or within the substrate other than those that are expected to be present. This examination may also identify the composition of the detected contaminants; if not, further examination of the substrate can be performed to accomplish such identification. Herein, a substrate that is examined to detect and identify contaminants present on the substrate is referred to as a "test substrate." A test substrate can be either a substrate that has been processed in the chamber during the normal course of operation of the chamber (which is a substrate referred to herein as a "process substrate") or a substrate that has been inserted into the chamber—and, if desired, subjected to specified operation of the chamber—specifically so that the substrate can subsequently be examined to determine whether there are contaminants present on or within the substrate (herein referred to as a "proxy substrate"). Following, a method that has been used to enable the detection and identification of contaminants in a process chamber is described.

First, a test substrate is examined to determine if any defects (or potential defects) are present on the substrate. Herein, such examination of a substrate is termed "defect detection." A defect may be a contaminant, but may also be something else, such as a stain on the substrate or a void formed in the substrate. Defect detection on a semiconductor wafer (or other semiconductor substrate) can be accomplished, for example, using a wafer scanner. A wafer scanner optically scans a substrate and detects the presence of one or more anomalous optical sites. For example, on a patterned semiconductor wafer, one die on the wafer can be compared to another die, or, on an unpatterned wafer, one defined region on the wafer can be compared to another defined region. Or, a site on a substrate can be compared to the corresponding site on another substrate of the same type that has previously been scanned or to the corresponding site on an artificial image that represents a substrate of that type. An anomalous optical site found by the wafer scanner may, but need not necessarily, represent a defect (e.g., stain, void, contaminant); the confirmation of the existence of a defect may require performance of additional examination of the substrate, as described below. The location and/or size of each identified site is provided as output from the wafer scanner. A wafer scanner can be embodied by, for example, a laser scanning system or a conventional video camera system. Various types of wafer scanners are commercially available from companies such as KLA Instruments of San Jose, Calif. and Tencor Instruments of Milpitas, Calif. (which companies have recently been combined into a single entity).

If defect detection indicates that one or more defects may be present on the substrate being examined (e.g., if a wafer scanner detects the presence of one or more anomalous optical sites on the substrate), the substrate can be further examined to determine, first, whether an identified site is the location of a contaminant or some other defect (or, perhaps, does not really represent a defect), and, second, in the former case, the type (e.g., composition) of the contaminant at the identified site. Herein, such examination of a substrate is termed "defect analysis" and, as particularly applied to identify the type of a contaminant, "contaminant analysis." Defect analysis can be accomplished, for example, using a scanning electron microscope (SEM) system. In an SEM system, an SEM emits high energy electrons so that the electrons strike a defined region of a substrate, causing electrons ("secondary electrons") to be released from elements that are part of the substrate and/or material formed on or within the substrate in the defined region. The energy of a secondary electron corresponds to the element from which that secondary electron was released. The intensity of secondary electrons of different energies is measured and analyzed by a detector/analyzer of the SEM system, thereby enabling determination of the types of elements that are present in the defined region of the substrate (i.e., measurement of a large intensity of electrons of a particular energy indicates the presence of the element that corresponds to that electron energy). Various types of SEM systems for performing defect analysis are commercially available. For example, an SEM that can be used in an SEM system as described above is the 7500WS microscope made by JEOL of Peabody, Mass. A detector/analyzer that can be used in an SEM system as described above is the Voyager system made by Noran of Middleton, Wis. As indicated above and discussed in more detail below, contaminant analysis is an important aid in identifying the source of a contaminant, which information can be used, in turn, to enable reduction of the presence of contaminants in the process chamber, with consequent improvement in the process yield obtainable from the chamber.

It can sometimes occur that a contaminant has a composition that includes one or more elements that are the same as an element included in the composition of a test substrate. Thus, when defect analysis as described above is performed on the test substrate, it is often difficult, when the presence of an element that is included in the composition of the test substrate is identified, to determine whether the output of the defect analysis tool has resulted from the presence of the element in a contaminant or from the presence of the element in the test substrate. Such difficulty can arise for a number of reasons. For example, when the defect analysis tool is an SEM, if the energy of the high energy electrons that bombard the substrate is sufficiently high, secondary electrons from elements underneath the surface of the substrate (e.g., underneath a contaminant) can be caused to be emitted from the substrate and detected by the SEM. Additionally, as illustrated and described in more detail below with respect to FIGS. 5A and 5B, as the size of a particle being examined by a defect analysis tool decreases relative to the size of a field of view (i.e., an area of the substrate that is examined at a particular time) of the defect analysis tool, the measured intensity of secondary electrons emitted from an element that is part of the particle decreases relative to the measured intensity of secondary electrons emitted from elements that are part of the surrounding substrate material. In any event, the above-described method of defect analysis is typically inadequate to enable the confident identification of the presence of an element as part of a contaminant where the element is also part of the composition of the test substrate.

For example, as is well known, semiconductor devices are often formed from substrates (e.g., wafers) comprised primarily or entirely (excepting incidental impurities) of silicon (hereinafter, for convenience, such substrates will be referred to simply as silicon substrates). It is not uncommon for a process chamber used to process a silicon substrate to have silicon particles present therein that are contaminants. Previously, defect analysis used in identifying contaminants in such process chambers has been performed using a silicon substrate as a test substrate (either a process substrate or a proxy substrate). When the above-described defect analysis method indicates that the material at a particular location on or within a silicon test substrate is silicon, it has been impossible or, at least, very difficult to determine whether such silicon is part of the substrate, part of silicon or a composition including silicon that has been properly formed on or within the substrate, or part of a contaminant including silicon.

It can also occur that a contaminant has a composition that includes one or more elements that are the same as an element included in the composition of a material that has been intentionally formed on or within a test substrate (often, in this case, the test substrate is a process substrate). For reasons similar to those given above, defect analysis as described above may be inadequate to enable the confident identification of the presence of an element as part of a contaminant where the element is also part of the composition of material that has been intentionally formed on or within the test substrate, particularly when such material has been formed at or near the location of the region of the substrate being analyzed. Thus, for example, the identification of the presence on a semiconductor test substrate of oxygen or aluminum, both materials that are commonly formed on semiconductor substrates, may be difficult to pinpoint with confidence as part of a contaminant, rather than as material that is properly formed on the test substrate.

A further problem arises when an SEM (or similar tool) is used to perform defect analysis on a test substrate made of silicon. The number of secondary electrons released from a given amount of silicon is large relative to the number of secondary electrons released from the same amount of some other elements (e.g., carbon). Thus, a given amount of silicon will generally produce an SEM output signal (i.e., secondary electron intensity) that is correspondingly larger than that produced by the same amount of one of such other elements. If both silicon and one of such other elements are present in a region of a substrate which is being analyzed, the SEM output signal associated with the silicon may dwarf the SEM output signal produced by the other element —particularly when the SEM produces graphical output that is scaled to fit into a predefined area—so that an SEM output signal corresponding to such element that is indicative of the presence of that element in the region of the substrate being analyzed may not be perceived as such. In other words, the relatively strong SEM output signal produced by silicon may, aside from masking the presence of contaminants including silicon, also obscure the presence of contaminants containing other elements. Further, this problem is exacerbated as the size of a contaminant decreases relative to the field of view of the defect analysis tool, since the magnitude of the SEM output signal produced by the elements of the contaminant will decrease even more relative to the magnitude of the SEM output signal produced by the silicon of the test substrate.

Moreover, even if a contaminant includes elements that produce strong SEM output signals relative to the SEM output signal produced by silicon, if the contaminant is sufficiently small, the SEM output signal from the silicon may overshadow the SEM output signal produced by the elements of the contaminant anyway. In other words, the relatively strong SEM output signal produced by silicon tends to, in general, hide the presence of relatively small contaminants.

Notwithstanding the above-noted problems, silicon substrates have been used as test substrates, particularly for identifying contaminants in semiconductor process chambers, for a variety of reasons. For instance, silicon substrates are readily available, since they are the most commonly used type of substrate in manufacturing semiconductor devices. Along the same lines, if the test substrate is a process substrate, the test substrate will most likely be a silicon substrate, since, as indicated above, such substrates are commonly used to manufacture semiconductor devices. Additionally, silicon substrates are relatively inexpensive compared to other types of semiconductor substrates (e.g., gallium arsenide substrates). Also, a silicon substrate is usually compatible (e.g., does not produce any undesirable reactions or other effects) with the process chamber being evaluated (as is evident from the fact that a silicon substrate is typically used as a process substrate).

SUMMARY OF THE INVENTION

The invention enables the identification of particles in a chamber in which a substrate is processed (e.g., a semiconductor process chamber used to process a semiconductor substrate). In particular, the invention can enable the identification of particles having a composition that includes one or more elements that are the same as an element included in the composition of a process substrate or substrates (i.e., a substrate or substrates that have been, or are of a type or types that are typically intended to be, processed in the chamber during the normal course of operation of the chamber). For example, the invention can enable the identification of particles including silicon in a semiconductor process chamber used to process silicon substrates. The invention can also enable identification of particles having a composition that includes one or more elements that are the same as an element included in the composition of a material that has been intentionally formed on or within a process substrate. For example, the invention can enable the identification of particles including oxygen and/or particles including aluminum in a semiconductor process chamber used to process silicon substrates on which material (e.g., silicon dioxide, aluminum) has been formed that includes those elements. These capabilities have been lacking in previous systems and methods used to identify particles present in a process chamber.

Generally, a method according to the invention that enables identification of the composition of a particle in a process chamber includes the steps of placing a test substrate in the process chamber and inspecting the test substrate. The composition of the test substrate is chosen so as to enable identification of particles having a composition that includes one or more of a predefined set of elements, as illustrated by examples of such test substrates described below. The inspection of the test substrate produces data regarding the composition of the test substrate and/or particles formed on or within the test substrate at a particular location on or within the test substrate, such data enabling identification of the composition of the particles.

If desired, the process chamber can be operated while the test substrate is in the process chamber. For example, when using the invention to identify contaminants present in the process chamber, it may be advantageous to operate the process chamber in a manner similar to that in which the chamber is operated during normal use in order to increase the likelihood that all possible sources of contaminants will produce a contaminant that is deposited on or within the test substrate.

The inspection of the test substrate can be accomplished in two steps by first ascertaining the location of a possible defect on or in the test substrate, then examining the substrate at the ascertained location to identify the elements present at the ascertained location. The examining step can be accomplished, for example, by using a scanning electron microscope, or by some other mechanism for producing data regarding the material at the ascertained location that can be correlated to one or more particular elements.

In one embodiment of the invention, the composition of the test substrate is chosen so that each of the elements that substantially comprise the composition of the test substrate are different than each of the elements that substantially comprise the composition or compositions of a process substrate or substrates. As explained in more detail below in the detailed description of embodiments of the invention, since the composition of the test substrate substantially includes elements that are different than each of the elements that substantially comprise the composition or compositions of a process substrate or substrates, a method according to the invention that makes use of such a test substrate enables the identification of the presence in a particle of an element that is part of the composition of a process substrate. Additionally, the composition of the test substrate can be further specified to substantially include elements that are different than each of the elements that substantially comprise the composition or compositions of a material or materials formed on or within the process substrate or substrates, thus enabling the identification in particles of those elements as well.

A method that makes use of a test substrate according to this embodiment of the invention can be used generally to identify the composition of particles in any type of process chamber used to process any type of substrate. It is contemplated that the method can be particularly advantageously used to identify the composition of particles present in a semiconductor process chamber and, in particular, such chamber that is used to process substrates made of silicon (or a composition of silicon and another element or elements) that may also have other materials formed thereon or therein (e.g., materials having a composition including elements such as oxygen or aluminum, such as are commonly formed on silicon substrates).

In another embodiment of the invention, the composition of the test substrate includes substantially no silicon. Since the test substrate includes no silicon, a method according to the invention that makes use of such a test substrate enables the identification of silicon in particles on the test substrate. This capability has not previously been possible with methods for using a test substrate to identify the composition of particles in a semiconductor process chamber (see the description in the Background section above).

In each of the embodiments described above, the test substrate can be made of, for example, Teflon™, gallium arsenide, ruby or some combination of those materials. These materials are useful, in particular, when the process substrate is made of silicon and/or a composition of silicon and another element or elements.

DETAILED DESCRIPTION OF THE INVENTION

The invention facilitates the identification of particles in a chamber in which a substrate is processed. The invention can be used, for example, in enabling the identification of the composition of particles in a semiconductor process chamber (i.e., a process chamber in which one or more semiconductor substrates are processed). Advantageously, the invention can enable the confident identification of particles having a composition that includes one or more elements that are the same as an element included in the composition of a substrate (process substrate) that has been, or is of a type that is typically intended to be, processed in the chamber during the normal course of operation of the chamber, or that is included in the composition of a material that has been intentionally formed on or within such substrate.

Figure 1:
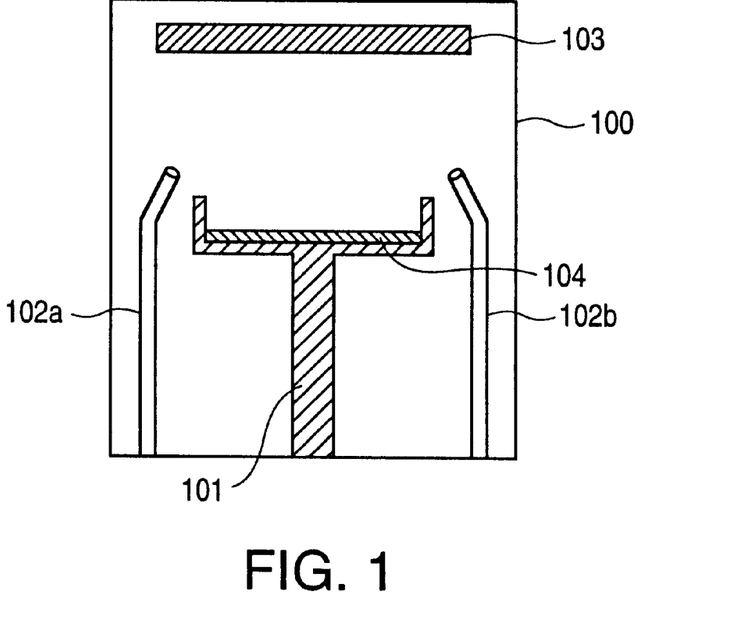
FIG. 1 is a simplified cross-sectional view of a process chamber for which the invention can be used to determine the composition of particles present therein.

FIG. 1 is a simplified cross-sectional view of a process chamber 100 for which the invention can be used to determine the composition of particles present therein. The process chamber 100 shown in FIG. 1 is a conventional sputtering chamber, which can be used, for example, to deposit a layer of material (e.g., a metal such as aluminum) on a semiconductor substrate. (A sputtering chamber is shown in FIG. 1 only for purposes of illustrating a process chamber; as described in more detail below, the invention can be used generally with any process chamber.) During sputtering in the process chamber 100, a substrate 104 is positioned in the process chamber 100 on a substrate support 101 such that the substrate 104 is underneath a sputtering target 103. A material to be deposited on the substrate 104 is formed on the sputtering target 103. A sputtering gas is injected into the process chamber 100 through gas inlets 102*a* and 102*b*, and ionized. The ions are accelerated toward the sputtering target 103. The ions strike the sputtering target 103, dislodging atoms of the material from the sputtering target 103, resulting in the deposition of at least some of the dislodged atoms on the substrate 104.

As discussed above, contaminants present in a process chamber (e.g., process chamber 100) can end up on or within a substrate that has been processed in the process chamber, thus reducing the process yield associated with the process chamber. Contaminants may arise from, for example, chemical residue that builds up on surfaces within the process chamber, substrate pieces from broken or chipped substrates, and/or products of unintended chemical reactions that take place in the process chamber. As also indicated above, contaminant analysis is an important aid in identifying the source of a contaminant, which information can be used, in turn, to enable reduction of the presence of contaminants in the process chamber, with consequent improvement in the process yield obtainable from the chamber. For example, if the process chamber is used to process silicon substrates, the presence of silicon contaminants may indicate the presence of silicon chips from broken or chipped substrates. Or, the presence of a polymer contaminant in an etch chamber may indicate a chemical residue buildup somewhere in the chamber.

Figure 2:
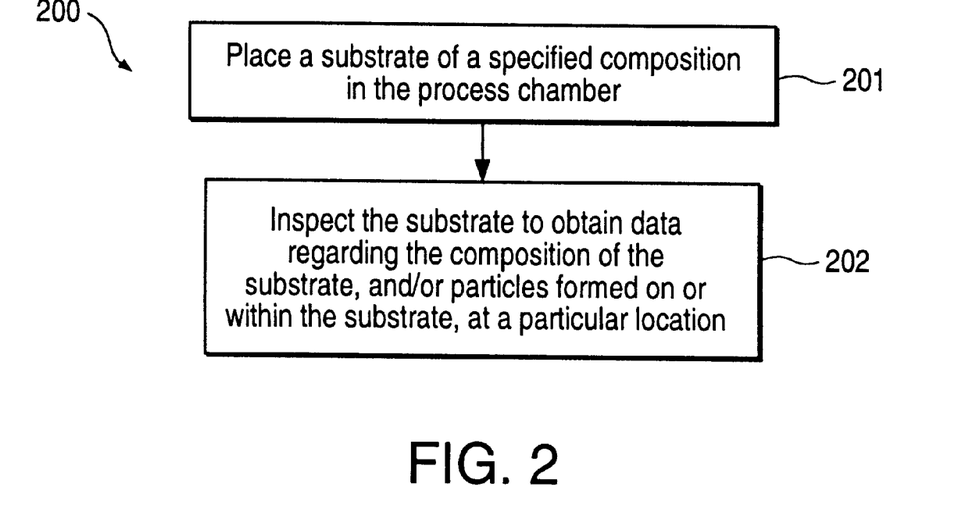
FIG. 2 is a flow chart of a method in accordance with the invention.

FIG. 2 is a flow chart of a method 200, in accordance with the invention, that enables identification of particles that are formed on or within a substrate that has been present in a process chamber such as the process chamber 100. As indicated above, a problem in previous approaches to identifying the composition of contaminants in a process chamber has been that the data obtained from such approaches does not enable identification (either at all or with an acceptable degree of certainty) of contaminants having a composition that includes one or more elements that are also included in the composition of a process substrate or material that has been intentionally formed on or within the process substrate. As indicated above and described further below, the method 200 can be implemented so as to overcome this problem.

In step 201 of the method 200, a substrate (test substrate) having a specified composition is placed in a process chamber for which it is desired to determine the composition of particles present therein. The step 201 is illustrated, for example, in FIG. 1, which shows the substrate 104 positioned on the substrate support 101 in the process chamber 100. The composition of the test substrate is chosen so as to enable detection of particles having a composition that includes a particular element or elements. For example, the composition of the test substrate can be specified to not include any elements that are part of the composition or compositions of a process substrate or substrates. The composition of the test substrate can be further (or alternatively) specified to not include any elements that are part of the composition or compositions of a material or materials that are formed on a process substrate or substrates. Or, the composition of the test substrate can be specified to not include a particular element or elements (e.g., silicon) that it has not been possible to confidently identify in previous methods for identifying particles in a process chamber. Some examples of the composition of test and process substrates are discussed in more detail below.

The process chamber can be operated during the time that the test substrate is present in the process chamber or the test substrate can simply be placed in the process chamber for a period of time. Generally, the process chamber can be operated in any desired manner, subject only to the limitation that such operation not damage the substrate. For example, when using the invention to identify contaminants present in a process chamber, it may be advantageous to operate the process chamber in a manner similar to that in which the chamber is operated during normal use (or in any other appropriate manner) in order to agitate sources of contaminants in the process chamber so that contaminants are introduced into the process chamber atmosphere, thereby increasing the likelihood that the contaminants will be deposited on or within the test substrate and detected by the method of the invention. On the other hand, operation of the process chamber entails expense; therefore, it may be desirable to refrain from operating the process chamber, instead simply placing the substrate into, then removing the substrate from, the process chamber in the step 201. Further, operation of the process chamber may require or make desirable use of a test substrate made of a particular material (e.g., having resistance to a particular chemical environment or to high temperatures, as discussed further below), militating against such operation if such test substrates are not readily available or are expensive. Additionally, operating the chamber may not be necessary to adequately stir up particles in the chamber: particles may be continually falling from surfaces in the chamber and/or simply inserting and removing the test substrate into the chamber may be adequately agitate sources of particles (due to, for example, pumping out the chamber before inserting the substrate)

In step 202, the test substrate is inspected, as described in more detail below. The inspection of the test substrate produces data regarding the composition of the test substrate and/or particles on or within the test substrate at a particular location or locations on or within the test substrate. In general, the data obtained during the inspection step 202 can be any data for which a correspondence exists between the content of the data and the composition of the material formed at the location of the test substrate from which the data is obtained. Typically, the inspection step 202 is performed after the substrate has been removed from the process chamber, since removal of the substrate from the process chamber is usually either necessary or desirable for the apparatus used to accomplish the inspection step 202 to be used. However, the inspection step 202 can be performed while the substrate is still positioned in the process chamber.

Figure 3:
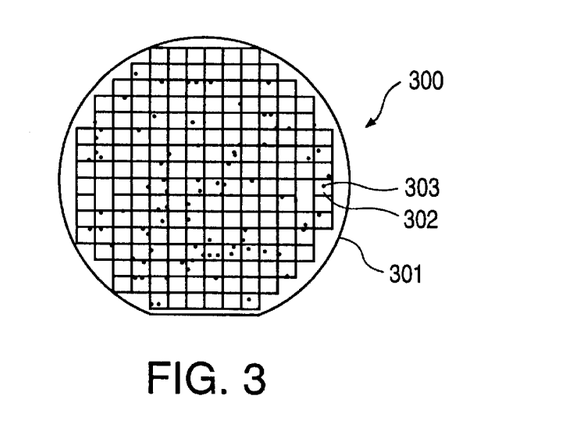
FIG. 3 illustrates a defect map on a semiconductor wafer, such as might be produced by a wafer scanner used to implement a defect detection step used as part of a method according to the invention.

In one embodiment of the invention, inspection of the test substrate is accomplished in two parts. First, the location of defects (e.g., contaminants, stains or voids) on or in the test substrate is ascertained. This can be accomplished, for example, using a wafer scanner (as described above) to identify the location of anomalous optical sites that may represent a defect. The result of this part of the inspection of the test substrate can be, for example, a map of the location of potential defects on the substrate. FIG. 3 illustrates such a defect map 300 for a semiconductor wafer 301: each square (e.g., square 302) represents an area that should produce the same SEM output as that produced by the area of each other square (if no defects were present), while each dot (e.g., dot 303) represents a detected potential defect. Each square can be, for example, a die patterned on the wafer 301 (such as may be the case when the wafer 301 is a process substrate) or a predefined area on the wafer 301 (such as may be the case when the wafer 301 is a proxy substrate).

Second, the substrate is examined at one or more potential defect locations to determine the composition of material at such locations. This can be accomplished, for example, using a scanning electron microscope (SEM), as described above.

Figure 4A:
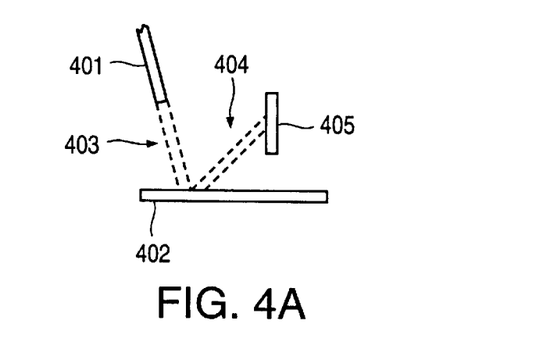
FIG. 4A is a simplified diagram illustrating the operation of a scanning electron microscope, such as might be used to implement a defect analysis step used as part of a method according to the invention.

FIG. 4A is a simplified diagram illustrating the operation of an SEM. An electron source 401 emits high energy electrons (indicated generally by the numeral 403 in FIG. 4A) so that the electrons strike a substrate 402 at or near a location identified as the location of a potential defect. When the high energy electrons 403 strike the substrate 402, they cause electrons ("secondary electrons," indicated generally by the numeral 404 in FIG. 4A) to be released from the substrate 402. A detector 405 is positioned so that the secondary electrons 404 strike the detector 405. Each secondary electron 404 has an energy associated therewith, the magnitude of the energy of the secondary electron 404 depending on the element from which the secondary electron 404 was released. The detector 405 measures the intensity (i.e., amount) of secondary electrons 404 of different energies that strike the detector 405, thereby enabling determination of the types of elements that are present at the location of the substrate 402 that is being struck by the high energy electrons 403 emitted from the electron source 401, as can be more completely appreciated from consideration of FIG. 4B.

Figure 4B:
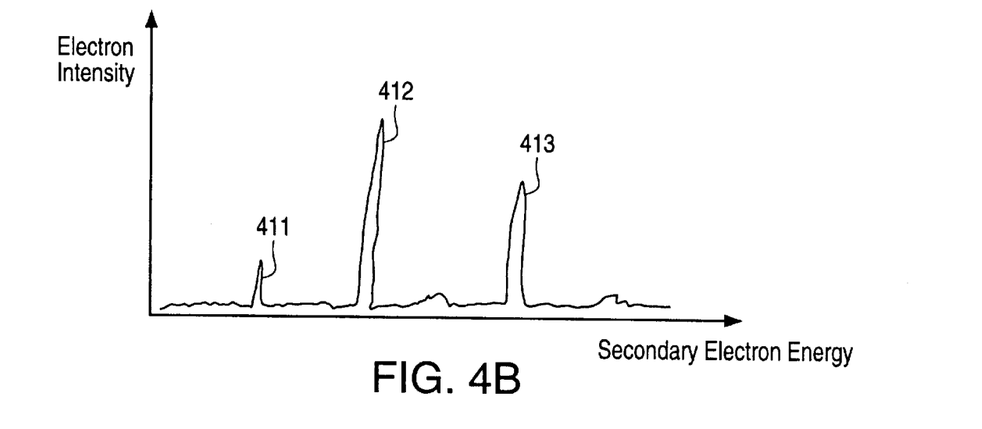
FIG. 4B is a graph illustrating the output from a scanning electron microscope.

FIG. 4B is a graph illustrating the output from an SEM. The horizontal axis represents magnitudes of secondary electron energy. The vertical axis represents the magnitude of the intensity of electrons of a particular energy. Since each secondary electron energy corresponds to the presence of a particular element, the magnitude of the intensity of a particular secondary electron energy generally indicates the amount of a particular material that is present on the substrate at the location being examined. Thus, elements that are present at the location being examined are indicated by spikes (e.g., spikes 411, 412 and 413 in FIG. 4B) in the graph of electron intensity versus secondary electron energy that is obtained as output from the SEM.

It can sometimes occur that a particle has a composition that includes one or more elements that are the same as an element included in the composition of a process substrate. When a test substrate has a composition that includes such an element, it is often difficult, when the presence of such element is identified to determine whether the element is part of a particle or part of the test substrate, making identification of particles including such elements difficult. For example, in a graph such as shown in FIG. 4B, it may not be possible to tell whether a spike that appears at a secondary electron energy corresponding to a particular element results from the presence of that element in the substrate at that location, in a particle at that location, or both. In particular, the above-described difficulty arises when the particle is relatively small, as illustrated in FIGS. 5A and 5B.

Figure 5A:
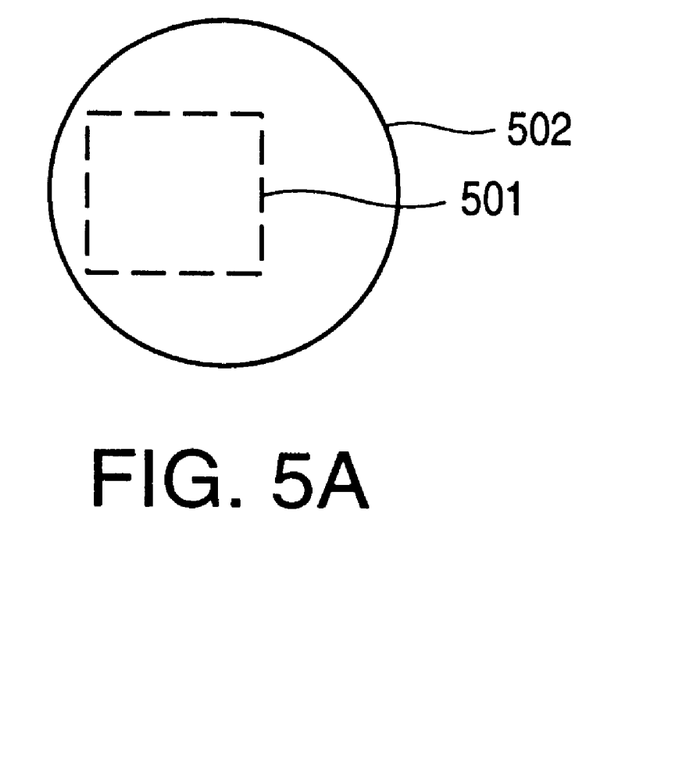
FIGS. 5A and 5B each illustrate the size of a field of view of an apparatus used to examine a substrate relative to the size of a particle being examined, FIG. 5A depicting a situation in which the size of the field of view is smaller than the size of the defect and FIG. 5B depicting a situation in which the size of the field of view is larger than the size of the defect.
Figure 5B:
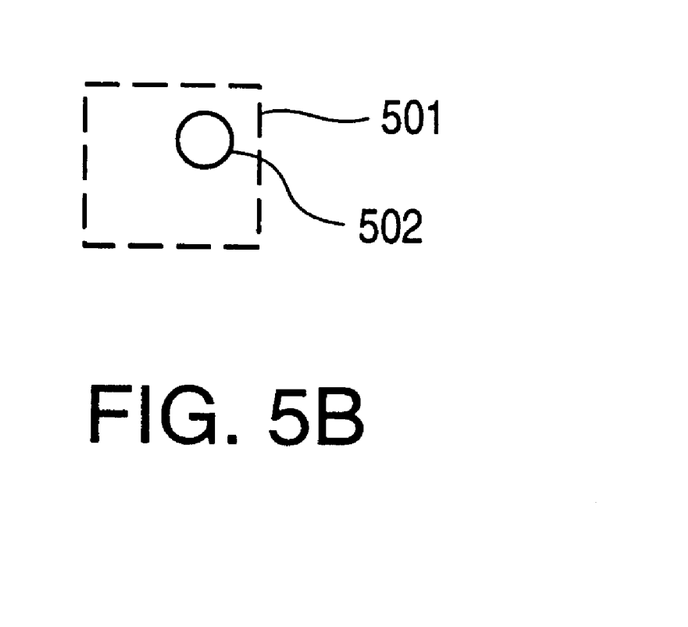

FIGS. 5A and 5B each illustrate the size of a field of view (i.e., an area of a substrate that is examined at a particular time) of an apparatus used to examine a substrate relative to the size of a particle being examined. FIG. 5A depicts a situation in which the size of a field of view 501 is smaller than the size of a particle 502. FIG. 5B depicts a situation in which the size of the field of view 501 is larger than the size of a particle 503.

In FIG. 5A, the field of view 501 is entirely consumed by the particle 502. Thus, if the examining apparatus is used correctly (e.g., the energy of electrons emitted from the electron source of an SEM is not too high, as described above), the output from the examining apparatus will reflect only the composition of the particle 502.

In FIG. 5B, the field of view 501 is only partially consumed by the particle 503. Thus, even if the examining apparatus is operated perfectly, the output from the examining apparatus will reflect not only the composition of the particle 502, but also the composition of the surrounding material (i.e., the substrate or material that is properly formed on the substrate). In fact, as illustrated in FIG. 5B, most of the area within the field of view 501 is consumed by such material; thus, it would be expected that the output from the examining apparatus will be primarily produced by the elements of that surrounding material. In any event, once the size of the particle has become sufficiently small that the field of view of the examining apparatus includes material surrounding the particle, the output produced by the examining apparatus for elements that are part of the composition of the test substrate becomes ambiguous.

As indicated above, it can be difficult or impossible to identify the presence of particles that have a composition including an element that is the same as an element that is part of the composition of a process substrate. Thus, according to one embodiment of the invention, the composition of the test substrate can be specified to not include any elements that are part of the composition or compositions of a process substrate or substrates. This embodiment enables confident identification of particles having a composition that includes one or more such elements, since the data indicating the presence of such element can only come from the particle and not from surrounding portions of the test substrate. For example, as is well known, semiconductor devices are often formed from substrates (e.g., wafers) comprised primarily or entirely (excepting incidental impurities) of silicon. For use with process chambers used to process such semiconductor process substrates, a test substrate having a composition that does not include silicon can be used.

Similarly, according to a further embodiment of the invention, the composition of the test substrate can be specified to not include any elements that are part of the composition or compositions of material that has been intentionally formed on or within a process substrate, thus enabling confident identification of particles having a composition that includes one or more such elements. For example, as is well known, to form a semiconductor device (such as an integrated circuit chip), a silicon substrate can be subjected to one or more process steps which can result in the formation of additional material on or within the silicon substrate. This additional material may be, for example, silicon (of any type, e.g., doped or undoped), a combination of silicon with another material (e.g., silicon dioxide) or a material not containing silicon (e.g., aluminum). For use with process chambers used to process such semiconductor process substrates, a test substrate can be used that has a composition that does not include such materials that are known to be intentionally formed on process substrates.

A variety of materials can be used as test substrates in accordance with the invention. For example, Teflon™, gallium arsenide, ruby or some combination of those materials could be used. These materials are useful, in particular, when the process substrate is made of silicon and/or a composition of silicon and another element or elements. They are useful, as well, when the process substrate has typical material found on or within a semiconductor substrate, such as aluminum or oxygen, formed thereon or therein.

Teflon™ may be desirable because it is a durable material that is resistant to some semiconductor processing conditions, so that it can be used when it is desired to subject the test substrate to operation of the process chamber when the test substrate is being used to identify particles in a semiconductor process chamber having relatively mild operating conditions (e.g., a chamber operated at relatively low temperature, such as an etching chamber, which is commonly operated at 20° C. to 40° C.). Additionally, Teflon™ is a relatively inexpensive material (e.g., it is cheaper than gallium arsenide). However, a Teflon™ test substrate would probably have to be made specially for that purpose. Further, Teflon™ cannot be used in harsh operating conditions, such as high temperature environments (e.g., a 400° C. operating temperature as is commonly used in chemical vapor deposition chambers) or some environments in which a plasma is struck.

Gallium arsenide, though more expensive than Teflon™, may be desirable for use in identifying particles in a process chamber used to process silicon substrates, because test substrates would not have to be specially made, since substrates made of gallium arsenide are already used as semiconductor substrates for certain applications.

Ruby, though also more expensive than Teflon™, may also be desirable for use in identifying particles in a semiconductor process chamber, since it is resistant to relatively harsh semiconductor processing conditions (e.g., striking a plasma within the process chamber), making it useful when it is desired to subject the test substrate to operation of the process chamber when the test substrate is being used to identify particles in a semiconductor process chamber having harsh operating conditions.

Generally, the material used for the substrate is chosen as a result of a tradeoff among a number of factors, subject, of course, to the limitation that the composition of the test substrate enable detection of particles having a composition that includes a particular element or elements of interest. Such factors can include, for example, susceptibility to corrosion, resistance to thermal breakdown, cost and availability. Further, as the span (e.g., diameter, or length and width) of the substrate increases relative to the thickness (e.g., as semiconductor wafers having an 8 inch diameter and larger become more common), strength may also become a consideration.

In FIG. 4B, a spike in the graph of electron intensity versus secondary electron energy usually indicates the presence of an element at the location being examined. However, it may not always be clear whether a "spike" does, in fact, indicate the presence of the corresponding material. For example, for "spikes" of relatively small magnitude (e.g., spike 411 in FIG. 4B), it may be difficult to determine whether the magnitude of the electron intensity indicates the presence of the corresponding material or is just part of the background "noise" that typically produces a "measured" intensity at many values of secondary electron energy. Further, for reasons explained above, the presence of an element at the location being inspected may not necessarily produce a perceptible spike in the graph of electron intensity versus secondary electron energy. Such weak or nonexistent detection of an element can result from several causes.

For example, returning to FIG. 5B, as can be appreciated, as a particle becomes smaller relative to the size of the field of view of an examining apparatus, the output produced by the defect is masked to a progressively greater extent by the surrounding material. Thus, very small particles may not produce a perceptible output from the examining apparatus. Additionally, even for particles that are relatively large (though small enough to allow surrounding material into the field of view of the examining apparatus), the magnitude of the examining apparatus output produced by one or more elements in the surrounding material may be sufficiently large relative to that produced by one or more elements of the particle to mask the output produced by such elements.

Therefore, it may be desirable to use a test substrate that includes elements that produce relatively weak output from the examining apparatus (e.g., when the examining apparatus is an SEM, that produce a relatively small secondary electron intensity). For example, previously, test substrates made of silicon have been used to identify particles present in semiconductor processing chambers. However, as indicated above, when an SEM is used to inspect a test substrate, the magnitude of the secondary electron intensity produced by a given amount of silicon material is large relative to that produced by the same amount of material of some other elements, so that the silicon tends to mask the presence of such other elements. Teflon™ includes carbon and fluorine. Compared to silicon, these elements produce a relatively small secondary electron intensity for a given amount of material. Thus, using a test substrate made of Teflon™ may—in addition to enabling identification of silicon, oxygen, aluminum and other elements commonly used in semiconductor processing—enhance the capability of detecting certain elements (e.g., those that tend to produce a relatively small secondary electron intensity) and/or detecting small particles.

Generally, a method according to the invention can be used to identify the composition of particles in a process chamber of any type that is used to process a substrate of any material composition. In particular, it is contemplated that the invention can be advantageously used to identify particles present in semiconductor process chambers which are used to process a semiconductor substrate as part of formation of a semiconductor device. For example, the invention can be used to identify the composition of particles in semiconductor process chambers such as dry and wet etching chambers (e.g., oxide etching chambers, metal etching chambers such as aluminum and tungsten etching chambers, polysilicon etching chambers) that use any of a variety of etchants (e.g., sulfuric acid, buffered or dilute HF acid, nitric acid), deposition chambers (such as CVD and PVD chambers), implantation chambers, oxide furnaces, cleaning apparatus such as dump rinsers and spin/rinse dryers, and photolithographic apparatus such as steppers, coaters and developers. The previous list is merely illustrative, not comprehensive.

Various embodiments of the invention have been described. The descriptions are intended to be illustrative, not limitative. Thus, it will be apparent to one skilled in the art that certain modifications may be made to the invention as described above without departing from the scope of the claims set out below.

I claim:

1. A method for enabling identification of the composition of a particle in a process chamber, comprising the steps of:

placing a test substrate in the process chamber, wherein each of the elements that substantially comprise the composition of the test substrate are different than each of the elements that substantially comprise the composition or compositions of a process substrate or substrates; and inspecting the test substrate, wherein the inspection of the test substrate produces data regarding the composition of the test substrate and/or particles formed on or within the test substrate at a particular location on or within the test substrate.

2. A method as in claim 1, wherein each of the elements that substantially comprise the composition of the test substrate are different than each of the elements that substantially comprise the composition or compositions of a material or materials formed on or within the process substrate or substrates.

3. A method as in claim 1, further comprising the step of operating the process chamber for a duration of time while the test substrate is in the process chamber.

4. A method as in claim 1, wherein the step of inspecting the test substrate further comprises the steps of:

ascertaining the location of a possible defect on or in the test substrate; and examining the substrate at the ascertained location to identify the elements present at the ascertained location.

5. A method as in claim 4, wherein the step of examining the substrate is implemented using a scanning electron microscope.

6. A method as in claim 4, wherein the step of examining the substrate further comprises the step of producing data regarding the material at the ascertained location that can be correlated to one or more particular elements.

7. A method as in claim 1, wherein the process chamber is a semiconductor process chamber.

8. A method as in claim 1, wherein the composition or compositions of the process substrate or substrates includes silicon.

9. A method as in claim 1, wherein the composition of the test substrate includes Teflon™.

10. A method as in claim 1, wherein the composition of the test substrate includes gallium arsenide.

11. A method as in claim 1, wherein the composition of the test substrate includes ruby.

12. A method for enabling identification of the composition of a particle in a semiconductor process chamber, comprising the steps of:

placing a test substrate in the semiconductor process chamber, wherein the composition of the test substrate includes substantially no silicon; and inspecting the test substrate, wherein the inspection of the test substrate produces data regarding the composition of the test substrate and/or particles formed on or within the test substrate at a particular location on or within the test substrate.

13. A method as in claim 12, wherein the composition of the test substrate includes Teflon™.

14. A method as in claim 12, wherein the composition of the test substrate includes gallium arsenide.

15. A method as in claim 12, wherein the composition of the test substrate includes ruby.

16. A method as in claim 12, wherein each of the elements included in the composition of the test substrate produces, when analyzed by an SEM, a secondary electron intensity for a given amount of material that is less than the secondary electron intensity produced by the same amount of silicon.

* * * * *